United States Patent
Burukhin et al.

(10) Patent No.: US 9,886,442 B2
(45) Date of Patent: Feb. 6, 2018

(54) ENHANCED COMPRESSION, ENCODING, AND NAMING FOR RESOURCE STRINGS

(71) Applicant: Microsoft Technology Licensing, LLC, Redmond, WA (US)

(72) Inventors: Anatoliy Burukhin, Redmond, WA (US); Thomas Gary Moore, Duvall, WA (US); Thomas Jeffrey Lavoy, Redmond, WA (US); Rory Keary, Seattle, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 288 days.

(21) Appl. No.: 14/594,464

(22) Filed: Jan. 12, 2015

(65) Prior Publication Data
US 2016/0203151 A1    Jul. 14, 2016

(51) Int. Cl.
*H03M 5/00* (2006.01)
*G06F 17/30* (2006.01)
*H03M 7/30* (2006.01)

(52) U.S. Cl.
CPC .... *G06F 17/30097* (2013.01); *H03M 7/3077* (2013.01); *H03M 7/3088* (2013.01); *H03M 7/705* (2013.01)

(58) Field of Classification Search
CPC ........ H03M 7/00; H03M 7/30; H03M 7/3088; G06F 17/30097; G06F 17/2735; G06F 17/2223; G06F 17/30153; G06F 17/30123; G06F 17/30138
USPC ...................................... 341/51–55; 707/693
See application file for complete search history.

(56) References Cited

U.S. PATENT DOCUMENTS

| | | | |
|---|---|---|---|
| 5,301,337 | A | 4/1994 | Wells et al. |
| 6,166,666 | A | 12/2000 | Kadyk |
| 6,363,396 | B1 | 3/2002 | Klots et al. |
| 6,502,064 | B1 | 12/2002 | Miyahira et al. |
| 7,533,234 | B2 | 5/2009 | Rudelic et al. |
| 7,663,511 | B2 | 2/2010 | Burukhin et al. |
| 7,885,928 | B2 | 2/2011 | Harrington et al. |
| 7,962,453 | B2 | 6/2011 | Chandrasekaran |
| 8,024,306 | B2 | 9/2011 | Palliyil et al. |
| 8,244,846 | B2 | 8/2012 | Wong et al. |
| 8,321,439 | B2 | 11/2012 | Pudipeddi et al. |

(Continued)

FOREIGN PATENT DOCUMENTS

CN    103077199 A    5/2013

OTHER PUBLICATIONS

Bandara, Ravimal, "A Simple String Compression Algorithm", Published on: Jul. 10, 2011 Available at: http://www.codeproject.com/Articles/223610/A-Simple-String-Compression-Algorithm.

(Continued)

*Primary Examiner* — Lam T Mai

(57) ABSTRACT

Technology is disclosed herein for compressing, encoding, and otherwise reducing the size of resource files. In at least one implementation, similarity compression is employed to reduce the size of a resource file. In another implementation, map-less encoding is employed to reduce the number of bytes used to represent a resource string. Bit-level compression is employed in another implementation to reduce the quantity of bits used to encode each character in a string. In addition, implementations are disclosed related to technology for naming strings and accelerated string location and retrieval.

20 Claims, 13 Drawing Sheets

(56) References Cited

U.S. PATENT DOCUMENTS

| 8,326,605 | B2 | 12/2012 | Balegar et al. | |
|---|---|---|---|---|
| 2007/0233832 | A1 | 10/2007 | Narayanan et al. | |
| 2009/0089337 | A1 | 4/2009 | Perlin et al. | |
| 2010/0217771 | A1 | 8/2010 | Nash | |
| 2010/0251227 | A1 | 9/2010 | Arayasantiparb et al. | |
| 2011/0313756 | A1 | 12/2011 | Connor | |
| 2012/0086585 | A1 | 4/2012 | Allen | |
| 2012/0124566 | A1 | 5/2012 | Federighi et al. | |
| 2016/0203152 | A1* | 7/2016 | Burukhin .................. | G06F 8/00 707/693 |
| 2016/0203154 | A1* | 7/2016 | Burukhin .................. | G06F 8/00 707/693 |
| 2016/0204796 | A1* | 7/2016 | Burukhin ............ | H03M 7/3088 341/51 |

OTHER PUBLICATIONS

Sharma, et al., "An Improved Dynamic Bit Reduction Algorithm for Lossless Text Data Compression", In International Journal of Advanced Research in Computer Science and Software Engineering, vol. 4, Issue 7, Jul. 2014, 7 pages.

Navarro, et al., "A General Practical Approach to Pattern Matching over Ziv-Lempel Compressed Text", In Proceedings of 10th Annual Symposium on Combinatorial Pattern Matching, Jul. 22, 1999, 23 pages.

Islam, et al., "An Enhanced Short Text Compression Scheme for Smart Devices", In Journal of Computers, vol. 5, No. 1, Jan. 2010, 10 pages.

Brar, et al., "A Survey on Different Compression Techniques and Bit Reduction Algorithm for Compression of Text/Lossless Data", In International Journal of Advanced Research in Computer Science and Software Engineering, vol. 3, Issue 3, Mar. 2013, 4 pages.

Bhanarkar, et al., "SMS Text Compression through IDBE (Intelligent Dictionary based Encoding) for Effective Mobile Storage Utilization", In International Journal of Computer & Communication Technology, vol. 3, Issue 1, Retrieved on: Oct. 9, 2014, 5 pages.

Zhang, Nan, "Transform Based and Search Aware Text Compression Schemes and Compressed Domain Text Retrieval", In PhD Dissertation, Retrieved on: Oct. 9, 2014, 217 pages.

Kida, et al., "A Unifying Framework for Compressed Pattern Matching", In International Workshop on Groupware String Processing and Information Retrieval Symposium, Sep. 21, 1999, 8 pages.

Bille, et al., "Random Access to Grammar-Compressed Strings", In Proceedings of the twenty-second annual ACM-SIAM symposium on Discrete Algorithms, Jan. 23, 2011, 17 pages.

Bremler-Barr, et al., "Decompression-Free Inspection: DPI for Shared Dictionary Compression over HTTP", In Proceedings of the IEEE INFOCOM, Mar. 25, 2012, 9 pages.

"Class: RuntimeResourceSet", Retrieved on: Oct. 9, 2014 Available at: http://referencesource.microsoft.com/#mscorlib/system/resources/runtimeresourceset.cs.

"Platform Specific Resources", Published on: Dec. 22, 2011 Available at: http://bitsquid.blogspot.in/2011/12/platform-specific-resources.html.

* cited by examiner

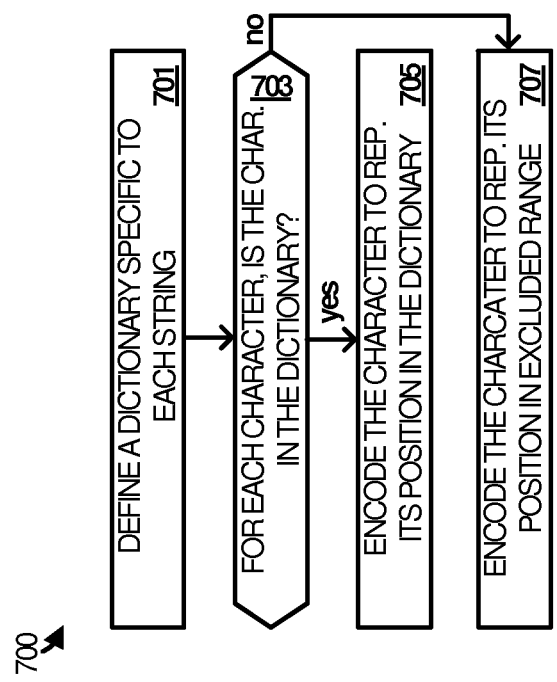

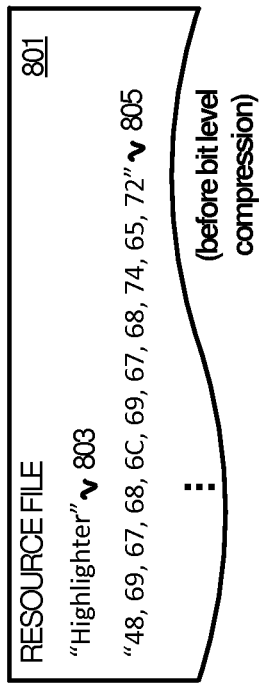
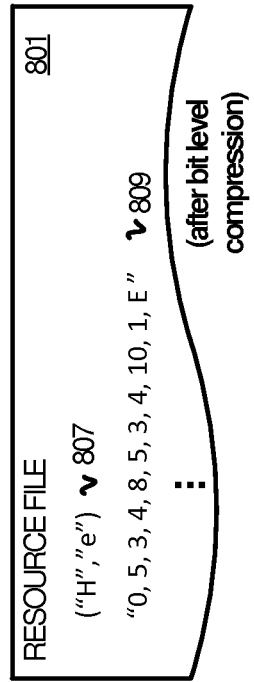

ENHANCED COMPRESSION, ENCODING, AND NAMING FOR RESOURCE STRINGS

TECHNICAL BACKGROUND

Many software applications include large quantities of resource strings, such as menu labels, feature descriptions, and other character strings that may be displayed in a user-interface to an application. A resource file or files is typically used to store the resource strings for an application or suite of applications. The resource file may be accessed at runtime by other components of the application when a particular string or set of strings is needed for display in a user interface to the application.

Compression and encoding technology may be employed during the build process to reduce the size of a resource file. A reduced file size is advantageous in view of bandwidth and storage constraints that may be encountered when provisioning and delivering an application. For example, a reduced file size may make downloading an application package faster than it otherwise would be. In addition, the reduced file size may require less local storage space once it has been downloaded to a local environment. Compression may be especially beneficial with respect to applications that provide support for language localization as a given menu label or other such user interface item may be described by multiple character strings, each in a different language.

While a variety of compression technologies exist for compressing text files, many are not well suited to compressing relatively short text strings, such as a resource string, because they usually do not exhibit a repetitive pattern. In addition, most compression technologies compress an entire file and then, during decompression, decompress the entire file at once. In contrast, resource strings are decompressed on a per-string basis when a string is needed, as opposed to decompressing an entire source file at that time.

Decompressing resource strings on a per-string basis mandates that a particular resource string be located quickly in a resource file. How strings are named can impact the speed with which they are found. Giving resource strings numerical identifiers in an index allows for fast look-up at runtime, but such identifiers are difficult to maintain over time, especially across multiple development and build platforms. Utilizing resource names may increase ease of use and maintainability, but results in slow look-up times at runtime.

A balance is therefore continuously sought between the storage gains achieved by resource string compression and encoding, and the performance load presented by decompression, decoding, and various naming constructs at runtime.

OVERVIEW

Provided herein are various implementations describing enhanced technology for compressing, encoding, and otherwise reducing the size of resource files. In addition, implementations are disclosed related to technology for naming strings and accelerated string location and retrieval. Any particular implementation disclosed below may be considered independently or in combination with any one or more of the other implementations.

In at least one implementation, similarity compression is employed to reduce the size of a resource file. Resource strings in the file are compressed based on their similarity to one or more other strings in the file. The compressed strings are comprised of a similarity value representative of the extent to which a string is similar to another, as well as a remaining portion of the string not represented in the value.

In another implementation, map-less encoding is employed to reduce the number of bytes used to represent a resource string. The high byte of each character in a string is eliminated, while the lower byte is preserved. In some cases, the lower byte may be shifted to avoid overlap with the byte value of another character or characters.

Bit-level compression is employed in another implementation to reduce the quantity of bits used to encode each character in a string. In bit-level encoding, a string-specific dictionary is created. Each character in the string is then encoded based on either its position in the dictionary or its relative position in a range that covers the other characters.

Lastly, resource strings are stored in association with hash values that are generated from the resource names for the strings. A resource strings is retrieved at runtime based on a proportionality relationship between the hash value for the resource string, the total number of possible hash values, and the quantity of strings in a resource file.

This Overview is provided to introduce a selection of concepts in a simplified form that are further described below in the Technical Disclosure. It may be understood that this Overview is not intended to identify key features or essential features of the claimed subject matter, nor is it intended to be used to limit the scope of the claimed subject matter.

BRIEF DESCRIPTION OF THE DRAWINGS

Many aspects of the disclosure can be better understood with reference to the following drawings. While several implementations are described in connection with these drawings, the disclosure is not limited to the implementations disclosed herein. On the contrary, the intent is to cover all alternatives, modifications, and equivalents.

FIG. 7A illustrates a bit-level compression process in an implementation.

FIGS. 8A-8B illustrate an implementation of bit-level compression.

TECHNICAL DISCLOSURE

Implementations of enhanced resource string compression and encoding technology are disclosed herein, including similarity compression, map-less encoding, and bit-level compression. In addition, an enhanced naming process may be utilized at build time when naming resource strings. A corresponding process is thus disclosed for locating resource strings in a resource file that are named in accordance with the convention.

With respect to similarity compression, resource strings in a resource file are compressed based on their similarity to one or more other resource strings. Map-less encoding allows each character in a resource string to be encoded with fewer bytes than otherwise—even when multiple languages occur in a string. Bit-level compression reduces the number of bits in each character byte in a resource string.

The enhanced naming process disclosed herein generates a hash value from the name given to a resource string. The hash value is then used for identifying the resource string in resource file. An enhanced location process is followed locally during runtime to locate a given resource string in a resource file that is named per its hash value.

Figure 1:
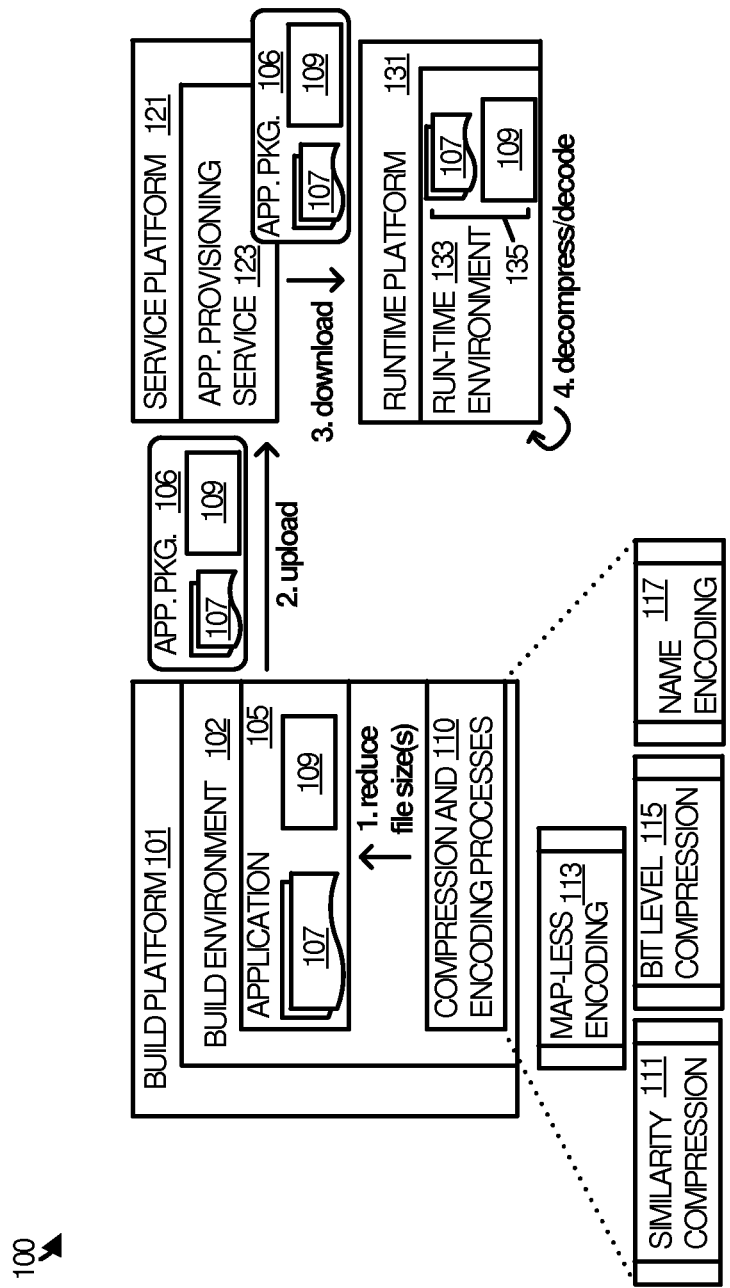
FIG. 1 illustrates an operational architecture and associated scenario in which various compression, encoding, and naming processes may be employed.

Referring to FIG. 1, operational architecture 100 includes a build platform on which build environment 102 is hosted. Application 105 is developed in the context of build environment 102 and readied for distribution. As a part of building application 105, build environment 102 includes compression and encoding processes 110, which may be applied to elements of application 105.

Application 105 may include a variety of elements that together form a program or suite of programs, non-limiting examples of which are represented by one or more resource files 107 and code 109. Various processes may be carried out in build environment 102 with respect to application 105 in order to produce an application package, such as compiling code, packaging binary code, running automated tests.

In addition, several compression and encoding processes 110 may be applied to one or more of resource files 107, which are represented by similarity compression process 111, map-less encoding process 113, bit-level compression process 115, and name encoding process 117. The compression and encoding processes 110 serve to reduce the size of at least one of resource files 107, as is discussed in more detail below with respect to FIGS. 2-8.

Application package 106, which includes resource files 107 and code 109, is representative of what may be produced by build environment 102 and uploaded or otherwise provided to service platform 121. While shown separately, build environment 102 may be integrated with service platform 121 and/or application provisioning service 123 in some implementations.

From there, application provisioning service 123 may distribute application package 106 in any of a variety of ways to runtime platforms for local execution. Runtime platform 131 is representative of one such local execution platform. For example, application package 106 may be downloaded to runtime platform 131 and installed as a local application 135 in runtime environment 133. In another example, application package 106 may be streamed into runtime environment 133 or provisioned as a web application that executes in the context of a browser application's runtime environment.

The contents of resource files 107 are decompressed and/or decoded at runtime, as resources stored therein are accessed by executing components of code 109. In particular, resource files 107 includes at least one resource file in which resource strings are stored. When needed, relevant strings are retrieved from the resource file, decompressed and decoded, and surfaced in a user interface to local application 135.

Figure 2:
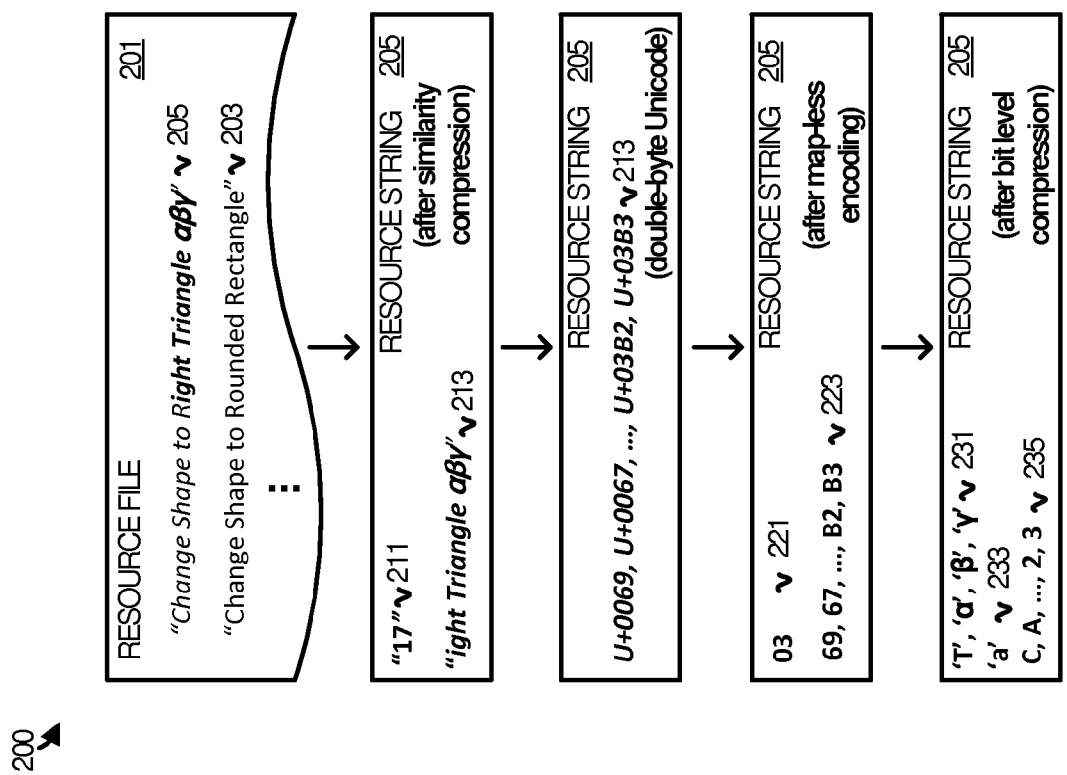
FIG. 2 illustrates an operational scenario in which a resource string is subject to similarity compression, map-less encoding, and bit-level compression.

Referring now to FIG. 2, operational scenario 200 illustrates various aspects of enhanced compression and encoding technology for resource strings as contemplated herein. Operational scenario 200 includes examples of similarity compression, map-less encoding, and bit-level compression as applied to a resource string, although it may be appreciated that one or more techniques may be skipped or modified.

Operational scenario 200 begins with respect to a resource file 201 that is part of an application build. Resource file 201 includes resource string 203 and resource string 205 for surfacing as text in a user interface to an application. Resource string 203 is text that reads "Change Shape to Rounded Rectangle" and may be, for example, a description for a shape formatting feature in a format menu. Resource string 205 is text that reads "Change Shape to Right Triangle αβγ," which includes both Latin text and non-Latin text.

In a first stage of operational scenario 200, similarity compression is applied to resource string 205. This involves a comparison of the similarity between resource string 203 and resource string 205. A resulting similarity value "17" is generated that represents the extent to which resource string 203 and resource string 205 are similar. Resource string 205 is compressed by substituting the value "17" for the first portion of resource string 205 that overlaps with resource string 203. Accordingly, resource string 205 after undergoing similarity compression includes a similarity value 211 and a remaining portion 213.

Next, a double-byte Unicode representation 213 of resource string 205 is analyzed. The double-byte Unicode representation 213 includes a Unicode value for each character in the remaining portion 213 of resource string 203 after having been compressed via similarity compression. Thus, the double-byte Unicode representation 213 begins with U+0069 for the Latin character "i" and U+0067 for the Latin character "g," and so on for the other characters. The last few characters of the remaining portion 213 of resource string 203 are non-Latin characters (Cyrillic in this example). U+03B2 is the Unicode value for "β" and U+03B3 is the Unicode value for "γ."

Each Unicode value may be understood to have two bytes—a high byte and a lower byte. The high byte of a Unicode value generally identifies a range of values in the Unicode map where a given character may reside and can correspond to certain languages. Thus, when the high byte of a character is "00," it may be understood that the character is a Latin character. But when the high byte of a character is "03," it may be understood that the character is a non-Latin character, such as a Cyrillic character.

When subjected to map-less encoding, each character in a resource string (or at least each character in the remaining portion of a resource string) is encoded using the lower byte of the Unicode representation of the character. Accordingly, the character "i" is encoded as "69" and the character "g" is encoded as "67," leaving off the high byte for each character. An encoding byte 221 is identified as the value of the high-byte for any non-Latin characters, which in this example is "03." The non-Latin characters using their lower-byte only. After map-less encoding, resource string therefor includes an encoding byte 221 and a set of values 223 that correspond to the lower byte of each character remaining in resource string 205.

Bit-level compression may then be applied to resource string 205 to further compress the string. With bit-level compression, the quantity of binary bits needed to represent the lower byte of each character remaining in resource string 205 is reduced from eight bits to five bits (or from some other quantity to a smaller quantity). In the map-less encoding stage, each character was reduced to one byte from two. In this next stage, the eight-bit lower-byte for each character can be reduced to five bits.

To accomplish bit-level compression, a dictionary 231 is identified for resource string 205 that includes the characters T, α, β, and γ. The character "T" is drawn from the word "Triangle," while the characters α, β, and γ are the last three characters in resource string 205 as originally presented. The character "a" is identified a range character 233 in the string suitable for anchoring a range of characters that are not included in the dictionary. Then, each character is compressed by encoding it with respect to either its location in the dictionary or its location relative to the range character.

For example, the hexadecimal Unicode value for the character "a" is U+0061, while the hexadecimal Unicode value for character "g" is U+0067. However, the hexadecimal value "67" in binary is "01100111," which is seven bits in length. To save bits, a difference between a subject character and the range character is calculated. The number of characters in the dictionary is then added to the difference to arrive at an offset value. The subject character is encoded in the binary representation of the offset value. Thus, in the preceding example, the character "g" is encoded as the hexadecimal value "A" (10 in decimal), which is the equivalent of the difference (6) plus the number of characters in the dictionary (4). Thus, "A" (hexadecimal) can be represented in just four binary bits: "1010."

The same routine can be applied to each character in resource string 205, resulting in the bit-level representation 235 of resource string 205: "C, A, . . . 2, 3." In other words, "i" is encoded as the hexadecimal value "C" (binary 1100) and "g" is encoded as the hexadecimal value "A" (binary 1010). The character "β" is encoded as "2", or "0010" in binary, and "γ" is encoded as "3," or "0011" in binary, to represent their respective locations in the dictionary.

Figure 3A:
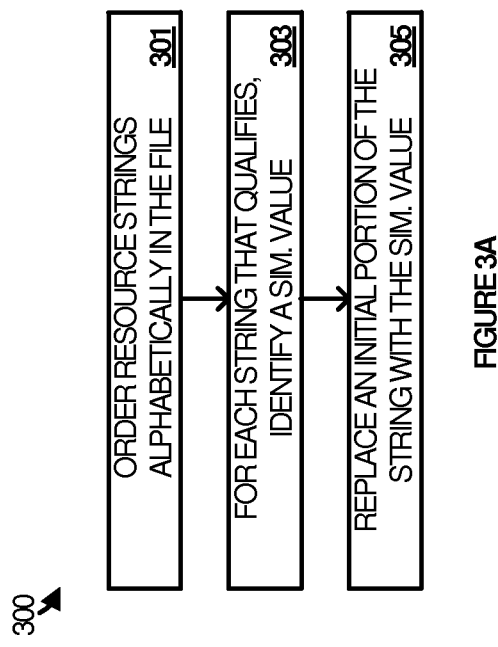
FIG. 3A illustrates a similarity compression process in an implementation.
Figure 10:
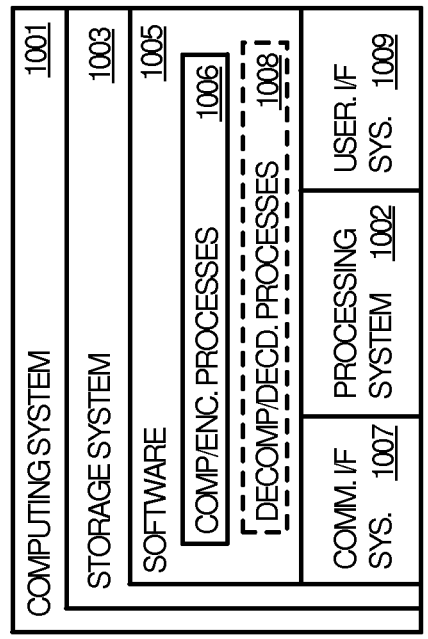
FIG. 10 illustrates a computing system suitable for implementing any of the processes and operational scenarios disclosed herein with respect to the Figures and discussed below in the Technical Disclosure.

FIG. 3A illustrates a similarity compression process 300 that may be employed in build environment 102 to carry out similarity compression in an implementation. Similarity compression process 300 may be embodied in program instructions executed by a suitable computing system, of which computing system 1001 in FIG. 10 is representative. The following discussion makes reference parenthetically to the steps illustrated in FIG. 3.

In operation, the resource strings in a resource file are ordered alphabetically (step 301). Each string in the resource file that qualifies for similarity compression is then analyzed to identify a similarity value for the string (step 303). The similarity value represents an extent to which a subject string is similar to a string occurring next alphabetically in the file.

Whether or not a string qualifies for similarity compression depends on its place in the alphabetically ordered file. For instance, the last string in the file would not qualify for similarity compression, as no other string would follow it. In another example, while a given string may be followed by other strings, a recursion depth may be too great to subject the string to similarity compression.

Upon identifying a similarity value for a qualifying resource string, an initial portion of the string is replaced with the similarity value (step 305). A remaining portion of the string is retained. The resource string moving forward would therefore be comprised of the similarity value and the remaining portion of the string.

Figure 3B:
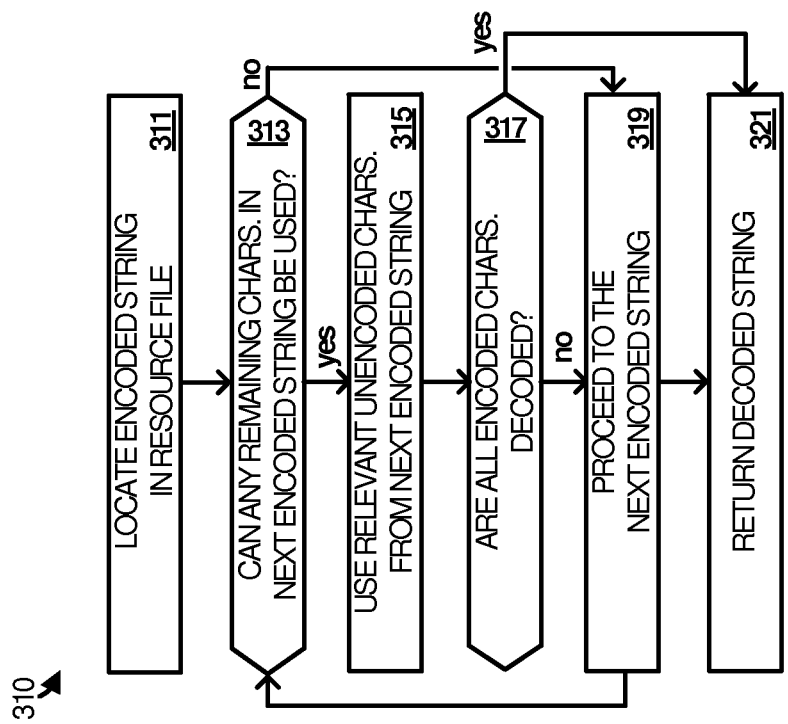
FIG. 3B illustrates a decompression process in an implementation.

FIG. 3B illustrates a decompression process 310 that may be employed by a local application to decompress a resource string at runtime. Decompression process 310 may be embodied in program instructions executed by a suitable computing system, of which computing system 1001 in FIG. 10 is representative.

In operation, a given string that is requested by a local application component is located in a resource file (step 311). Assuming the resource string is encoded in the manner discussed above with respect to FIG. 3A, it will include two parts: a similarity value and a remaining portion.

A next string in the resource file, relative to the subject string, is identified and analyzed to determine whether or not any un-encoded characters in the next string can be used to decode the subject string (step 313). That is, the remaining portion of the next string—as opposed to its similarity value—is analyzed to determine if any of those characters are relevant to the subject string.

If none of the next string's un-encoded characters can be utilized, then the process moves to the next string in the resource file (step 319) and the process continues until the subject string is decoded in its entirety. However, if any of the next string's un-encoded characters are relevant, they can be used to decode the compressed portion of the subject string (step 315).

If all of the subject string's encoded characters have been decoded (step 317), the subject string in its decoded form can be returned to the requesting application component (step 321). If some characters remain to be decoded, then the process moves to the next encoded string in the resource file (step 319).

Figure 4A:
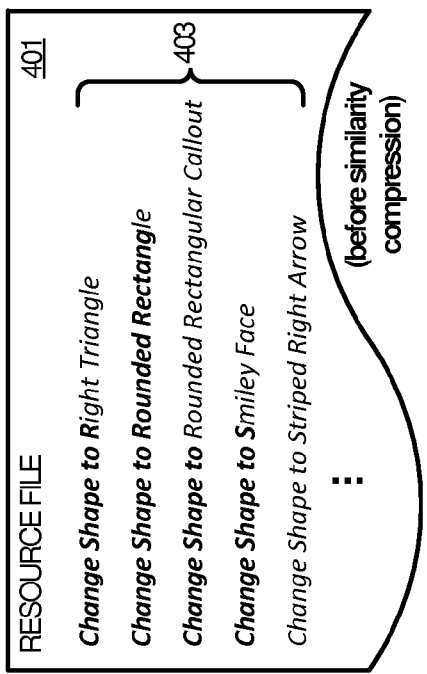
FIGS. 4A-4B illustrate an implementation of similarity compression.
Figure 4B:
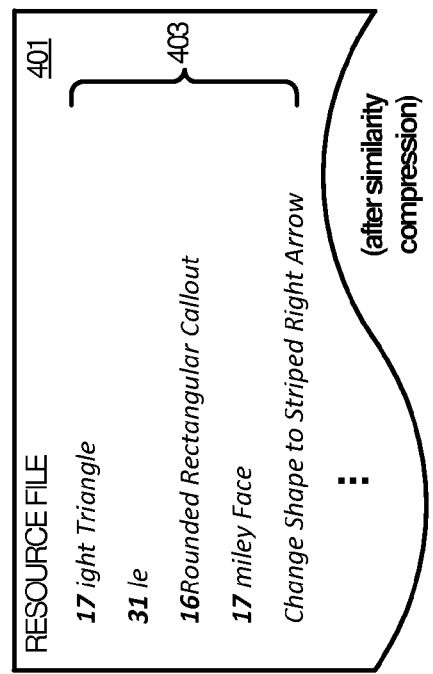

FIGS. 4A-4B illustrate an example implementation of similarity compression. In particular, FIG. 4A illustrates a resource file 401 prior to applying similarity compression to it. Resource file 401 includes various resource strings 403 that are ordered alphabetically from top to bottom. For instance, the first string reads "Change Shape to Right Triangle" and the last string reads "Change Shape to Striped Right Arrow."

FIG. 4B illustrates resource file 401 after having applied similarity compression to it. In FIG. 4B, all but the last one of the resource strings have been compressed. For instance, the first string now reads "17 ight Triangle." The number "17" is the similarity value that represents the extent to which the first string is similar to the next string in the ordered list of strings, which read "Change Shape to Rounded Rectangle." Likewise, the number "31" in the compressed string "31 le" represents the extent to which the second string is similar to the third string. The number "16" in the third compressed string represents how similar the third string was to the fourth string before compression. Finally, the number "17" in the fourth compressed string represents how similar the fourth string was to the fifth and last string in resource strings 403. The last string in FIG. 4B remains the same because, in a sense, it did not qualify for similarity compression due to its last position in the alphabetically ordered list of strings.

In the preceding example, the savings is roughly equivalent to the number of cut characters less a similarity number byte, times one less than the number of strings in a resource file. In other words, 61 out of 152 characters were saved.

To decompress the first string in resource file 401, the decompression stages for the first string of the sample are as follows. For the first 16 characters, recursively dive to the last string and obtain "Change Shape to." Collect the 17th character ("R") from the third string to produce "Change Shape to," plus "R." Add remaining characters from the first string to obtain "Change Shape to," plus "R," plus "ight Triangle."

Figure 5A:
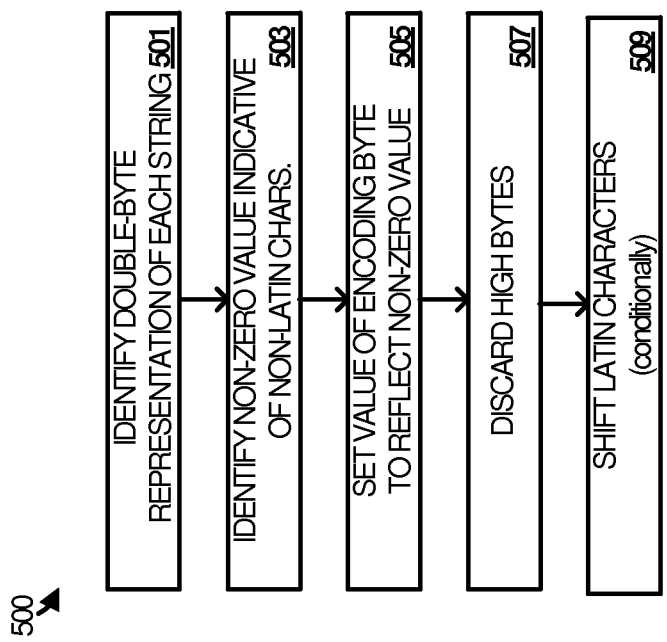
FIG. 5A illustrates a map-less encoding process in an implementation.

FIG. 5A illustrates a map-less encoding process 500 that may be employed in build environment 102 to carry out map-less encoding in an implementation. Map-less encoding process 500 may be embodied in program instructions executed by a suitable computing system, of which computing system 1001 in FIG. 10 is representative. The following discussion makes reference parenthetically to the steps illustrated in FIG. 5.

An appreciation of the Unicode encoding model may assist with an understanding of map-less encoding. The Unicode encoding model keeps code points of the same script in a consecutive range. Alphabet and alpha-syllabary script ranges are generally short. Usually an alphabet is within 128 code points. A basic alphabet is either in the first or last 128 characters of a 256-characters range.

A double-byte Unicode code point could be divided as a byte of a range and a significant byte of a character. The range byte is the same for a language. Alphabet languages are all below 0x8000. It is an optional assumption that allows using one highest bit of an encoding byte as a flag.

In map-less encoding as contemplated herein, one byte has enough bits to encode 256 characters or, according to the above calculation, two languages. The first "language" could always be the basic Latin range with numbers and punctuation. The second language could be the language of a particular string. The language or Latin ranges could be shifted to either the upper or lower half of 256 characters. The language range byte could be extracted and stored separately.

Referring to FIG. 5, a double-byte representation for each character in a resource string is identified (step 501). In a Unicode example, a character may be represented by two bytes: a high byte and a lower byte. Next, the characters in a resource string are analyzed for the occurrence of any non-Latin characters (step 503). This is accomplished by examining the high byte of each character for the occurrence of non-zero values. As the high byte of Latin characters in Unicode is represented by "00," the presence of non-zero values indicates that a character is a non-Latin character, such as a Cyrillic character.

When a non-zero value is encountered, the value of an encoding byte is set to equal the non-zero value (step 505). The encoding byte serves to identify which other language in addition to Latin is reflected in a resource string.

Upon identifying an encoding byte, the high byte of each character in a resource string is discarded (step 507). In the aggregate, discarding the high byte of each character in a string reduces the size of the string. Doing so for each resource string in a resource file reduces the size of the file.

Under some conditions, the value of the low byte of any Latin characters is shifted so as not to collide with the value of the low byte of any non-Latin characters (step 509). The non-Latin characters are either in lower or upper half of 256. If it is the low part then the non-Latin and Latin will conflict after removing high bytes. Thus shifting is necessary to distinguish Latin and non-Latin in this case. If shifting is necessary and the character is a Latin one, then add a mask (0x80) to the low byte. In addition, and if shifting is necessary, then apply the mask to the encoding byte. The mask bit is an indicator of shifting for decompression code.

Figure 5B:
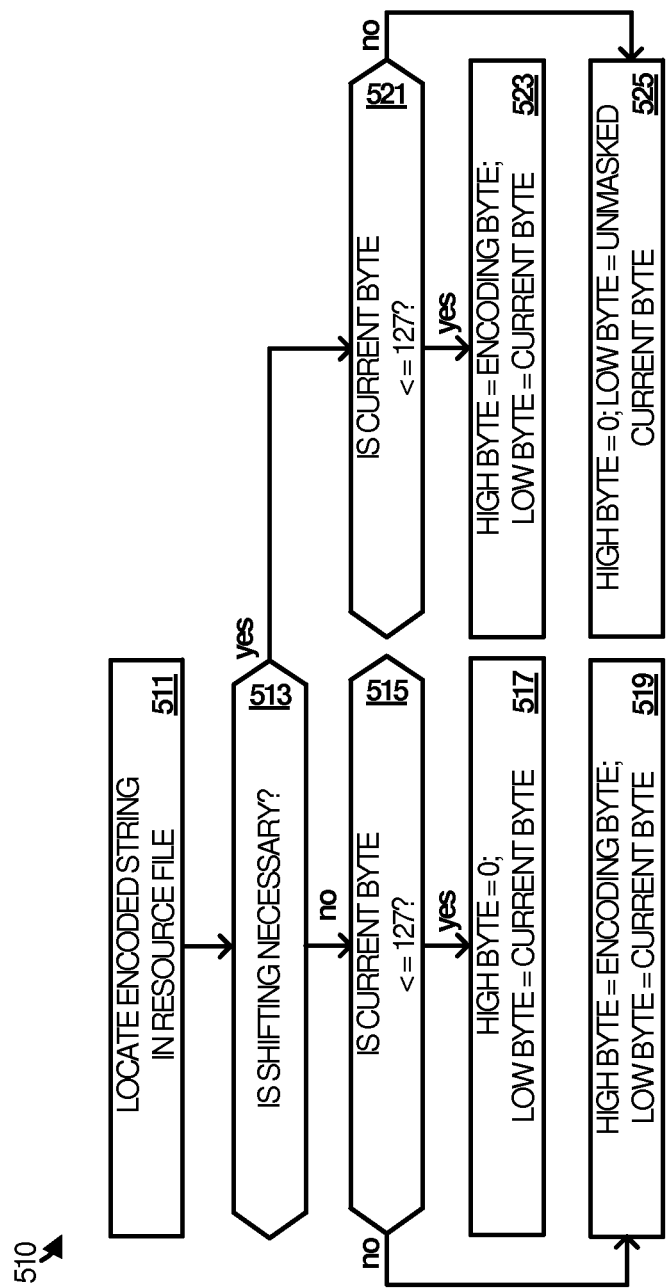
FIG. 5B illustrates a decoding process in an implementation.

FIG. 5B illustrates a decoding process 510 that may be employed by a local application to decode a resource string at runtime that was subject to map-less encoding during build. Decoding process 510 may be embodied in program instructions executed by a suitable computing system, of which computing system 1001 in FIG. 10 is representative.

In operation, a given string that is requested by a local application component is located in a resource file (step 511). Assuming the resource string is encoded in the manner discussed above, a Unicode double-byte character (high and low byte) is created for each byte of content in the encoded resource string. The first step for each character is to determine whether or not shifting is necessary (step 513). If shifting occurred during the encoding process, then shifting is necessary when decoding.

If shifting is unnecessary, and if the value of the current byte is less than or equal to 127 (step 515), then the value of the high byte is set to 0 and the value of the low byte is set to equal the value of the current byte (step 517). Otherwise, the high byte is set to the value of the encoding byte and the low byte is set to equal the value of the current byte (step 519).

If shifting is necessary and if the current byte is less than or equal to 127 (step 521), then the high byte is set to equal the value of the encoding byte and the low byte is set to equal the value of the current byte under consideration (step 523). Otherwise, the value of the high byte is set to 0 and the low byte is set to equal the unmasked (shifted) value of the current byte (step 525).

Figure 6A:
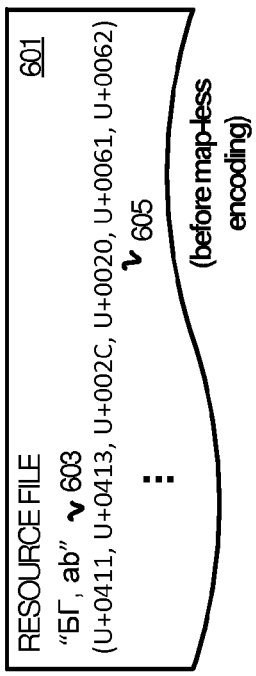
FIGS. 6A-6C illustrate an implementation of map-less encoding.
Figure 6B:
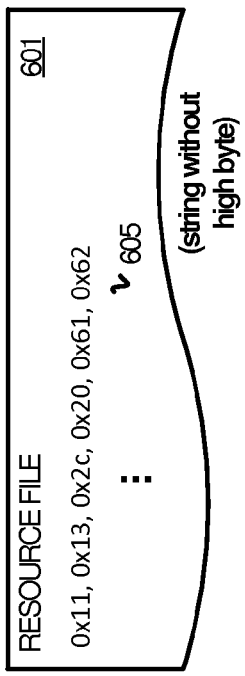
Figure 6C:
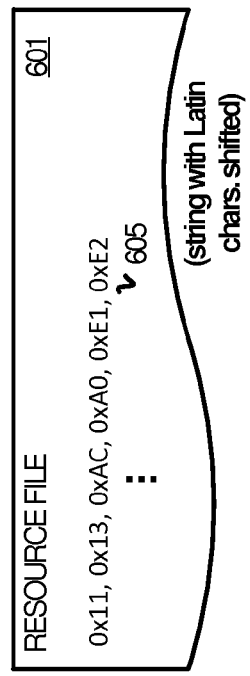

FIGS. 6A-6C illustrate an example implementation of map-less encoding. In FIG. 6A, resource file 601 is illustrated in a state prior to map-less encoding. Resource file 601 includes a text-based representation 603 of a resource string and a Unicode representation 605 of the same resource string. The text-based representation 603 of the resource string is "БГГ, ab" which includes both Latin and non-Latin characters. The Unicode representation 605 is given in hexadecimal notation as "U+0411, U+0413, U+002C, U+0020, U+0061, U+0062."

The first text character in the string is the letter "Б," which corresponds to the Unicode value "0411." The high byte in the Unicode value is "04," whereas the lower byte is "11." The second text character is the letter "Г," which corresponds to the Unicode value "0413." The third text character is the common symbol, which corresponds to the Unicode value "002C." The fourth text character is the space symbol, which corresponds to the Unicode value "0020." The fifth text character is the letter "a," which corresponds to the Unicode value "0061." The sixth and last text character in the string is the letter "b," which corresponds to the Unicode value "0062."

In FIG. 6B, the Unicode representation 605 of the resource string is given with the high bytes discarded and the lower bytes retained. Thus, U+0411 has been reduced to 11; U+0413 has been reduced to 13; U+002C has been reduced to 2C; U+0020 has been reduced to 20; U+0061 has been reduced to 61; and U+0062 has been reduced to 62.

In FIG. 6B, the Unicode representation 605 of the resource is given with the high bytes, discarded, the lower bytes, retained, and the value of Latin characters shifted to avoid potential overlap with the lower byte of any non-Latin characters. The Unicode representation 605 thus becomes "0x11, 0x13, 0xAC, 0xA0, 0xE1, 0xE2."

FIG. 7A illustrates a bit-level compression process 700 that may be employed in build environment 102 to carry out bit-level compression in an implementation. Bit-level compression process 700 may be embodied in program instructions executed by a suitable computing system, of which computing system 1001 in FIG. 10 is representative. The following discussion makes reference parenthetically to the steps illustrated in FIG. 7.

In operation, a string-specific dictionary is defined for each resource string in resource file (step 701). In other words, a different dictionary is defined for each resource string in a file. To compress a given resource string, each character in the string is analyzed to determine whether or not the character is present in the dictionary for that string (step 703).

For any of those characters found in the dictionary, the character is encoded to represents its relative position in the dictionary (step 705). For any of those characters not found in the dictionary, the character is encoded to represents its position in a range of characters that are excluded from the range (step 707).

Figure 7B:
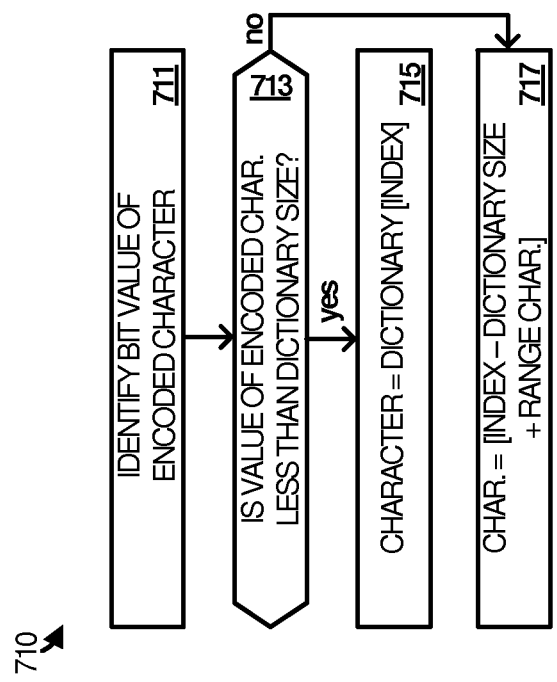
FIG. 7B illustrates a decompression process in an implementation.

FIG. 7B illustrates a decompression process 710 that may be employed by a local application to decompress a resource string at runtime that was subject to bit-level encoding during build. Decompression process 710 may be embodied in program instructions executed by a suitable computing system, of which computing system 1001 in FIG. 10 is representative.

In operation, the bit value of an encoded character is identified (step 711). This occurs when a given string that is requested by a local application component is located in a resource file and the individual characters in the string are parsed on a per-five bit basis.

Then, for each character in the resource string, the five-bit value of the character is analyzed to determine whether or not its value is less than the size of the dictionary for the string to which it belongs (step 713). If so, then the value of the character is converted to the value of the character in the position in the dictionary that corresponds to the five-bit value of the character (step 715). In other words, the five-bit value of the character represents an index to the dictionary and the actual value of the character is the value represented by the indexed position in the dictionary.

If the five-bit value of the character is not less than the size of the dictionary, then the value of the character is set to equal its index size (five-bit value), less the dictionary size, plus the value of the range character with which the resource string was encoded (step 717). In this manner, the five-bit representation of the character in its bit-level encoded state is decoded and equals either a character represented in the dictionary or a character defined by an offset relative to the range character.

FIGS. 8A-8B illustrate an example implementation of bit-level compression. To better understand the example in FIGS. 8A-8B, it may be appreciated that most alphabet characters are stored consecutively in Unicode. In addition, most alphabets have less than 32 letters. An average short string in a natural language requires no more than 5 bits per character (32 letters). Thus, if a string is a combination of less than 32 letters and symbols, then it can be encoded with five-bit (binary) compression.

In FIG. 8A, resource file 801 includes a resource string 803 that reads "Highlighter." A corresponding single-byte Unicode representation 805 of the resource string in hexadecimal is also illustrated in FIG. 8A and reads "48, 69, 67, 68, 6C, 69, 67, 68, 74, 65, 72."

When subjected to bit-level compression, a dictionary specific to resource string 803 is generated that includes the letter "H." In addition, a range character "e" is identified. The dictionary and the range character are included in parameters 807 that are used to encode the characters of the resource string. Accordingly, the letters of resource string 803 are encoded as follows, the values 809 of which are given in hexadecimal.

The letter "H" is encoded as "0" to denote its place as the first character in the dictionary. The other letters of the resource string 803 that are not included in the dictionary are instead encoded with a value that represents a relative distance from the range character "e," plus a size of the dictionary. Thus, "i" is encoded as 6 (4+1); "g" is encoded as 3; "h" is encoded as 4; "l" is encoded as 8; "i" is again encoded as 5; "g" is again encoded as 3; "h" is again encoded as 4; "t" is encoded as 10; "e" is encoded as 1; and "r" is encoded as E. Note that when converted to binary, none of the encoded values exceeds five bits.

Figure 9:
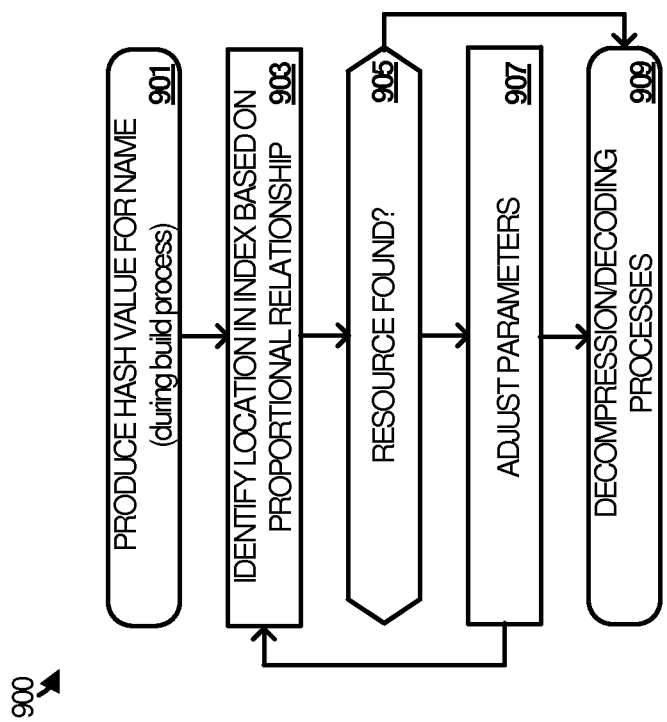
FIG. 9 illustrates a process for locating resource strings.

FIG. 9 illustrates a process 900 that may be employed at least partially in runtime environment 133 to carry out an enhanced naming convention for resource strings. Process 900 may be embodied in program instructions executed by a suitable computing system, of which computing system 1001 in FIG. 10 is representative. The following discussion makes reference parenthetically to the steps illustrated in FIG. 9.

To begin, a hash value has been produced to identify each resource string in a resource file (step 901). This step is carried out during the build process and occurs in the context of a build environment. The hash value is produced by inputting the name of a resource string into a hash function that generates a distribution of hash values.

The lookup goal is to find the resource ID in ID-Content array with minimum iterations. The distribution of probe indexes should be as close as possible to the targeted index. The narrow distribution is necessary to reduce hardware access as an operating system reads data from a hard drive by large chunks (pages). If all probe indexes are within the same page, then the operating system reads the hard drive only once. The following is a sample function that converts an input resource name to a hash number and after that randomizes bits.

```
DWORD HashResName(const WCHAR* pwz)
{
DWORD hash = 5381;
   for (int i = 0; pwz[i] != 0; i++)
hash = ((hash << 5) + hash) ^ pwz[i];
hash = (((hash * 1103515245 + 12345) >> 16) | ((hash * 69069 + 1) & 0xffff0000));
   return hash;
}
```

At runtime when a resource string is needed by an application, the resource string is invoked using the hash value assigned to it during the build process. However, the actually resource string (or a pointer to it) must be found in the resource file before it can be read and provided to the calling application or component. The location of the resource string in the file is identified based on a proportional relationship between the hash value and the total number of possible hash values (step 903). This proportion or ratio is then applied to the resource file and the total number of resource strings in the file to find an approximate location of the resource string. The lookup is based on this proportion:

$$\text{Index} = \frac{\text{Hash value}}{0x\textit{ffffffff}} * \text{Number of resources}$$

If the resource string is found (step 905), then decompression and/or decoding processes are applied to the string that correspond to the similarity compression, map-less encoding, and bit-level compression discussed above (step 909). However, if the resource string is not found, then search parameters are adjusted (907) that redirect or narrow the search of the resource file for the string. The process continues with additional parameters adjustments as necessary, or until the string is found.

In some implementations, there may be grouped resources. The groups (string tables) band several resource into a functional unit. The group could be considered as a list or an array of resources.

When this occurs, a compound value may be utilized to identify a resource and may be represented by two 16-bit integers. The high 16-bit WORD is a table ID. The low WORD is a resource identifier within the table (usually a zero-based index in the table lookup array).

The compound ID structure can be a part of a resource API. For example, enumerating resources in a table could be implemented as increasing ID by 1 in a loop. As compound IDs are widely used in some code for application suites, the ID notation contemplated herein may keep this structure for grouped resources.

The low WORD of such an ID cannot be a hash value because it is an index. But the high WORD can be a hash of a table name. Collision probabilities for 16-bit hashes are much worse than for 32-bit values. For instance, there is 7% probability of a collision for 100 table names. A new table name could cause a collision with 0.4% probability for 300 tables. These numbers are acceptable because new tables are much less frequent than new resources. A grouped resource ID could thus be a hash value of a table name (high WORD) and a resource index within the table (low WORD).

The following is a detailed algorithm that may be utilized to look-up a resource string at runtime.

At step A, set boundary values: Index_min=0; Index_max=Number of Ungrouped Resources−1; ID_min=0; ID_max=0xffffffff. If the binary does not contain resource tables, then continue to step B. Otherwise, try to find the resource in tables. Even if the resource is not in tables, the table array contain information that helps to narrow table-less lookup.

At step A1, find the table that could contain the resource with the requested ID. The table lookup occurs in the string table blob. It is an array of structures with table ID and other table information.

At step A1(a), the table ID is the high WORD of resource ID. Even if the resource is a table-less one, calculate a fake table ID. Table ID=(Resource ID & 0xffff0000)>>16.

At step A1(b), Try the following index in the tables array:

$$\text{Table Index} = \frac{\text{Table ID}}{0x\textit{ffff}} * \text{Number of Tables}$$

At step A1b), if the table ID on this index matches the targeted table ID, then the table is found.

Otherwise, at step A1(d) continuously check table IDs of neighbor array elements going up, if targeted ID is smaller, or down, if bigger.

At step A1(e), stop when the current table ID matches the targeted one, or when (ID Target−ID current) changes sign, or when the index hits top or bottom of the array.

At step A1(f), if necessary, adjust the index to meet the condition: Resource ID>=(Current Table ID<<16)) && (Resource ID<(Next Table ID<<16).

At step A2, if the following condition is true, then the resource is a grouped resource: (HIWORD(Resource ID)=Current Table ID && LOWORD(Resource ID)<Number of Table Resources).

At step A2(a), if true, the LOWORD(Resource ID) is an index in the table ID-Content array. Stop the lookup, the resource is found.

Otherwise, at step A2(b), the table structure contains the first index of an ungrouped resource with ID greater than the current table ID. It has nothing to do with the table itself, but helps to narrow the lookup with respect to step B. Therefore, assign: Index_min=Ungrouped Index of Current Table; Index_max=Ungrouped Index of Next Table; ID_min=(Current Table ID<<16); ID_max=(Next Table ID<<16).

At step B, find the resource ID in an ID-Content array of ungrouped resources.

At step B1, Calculate the current index:

$$\text{Index} = \frac{Index_{max} - Index_{min}}{ID_{max} - ID_{min}} * (ID - ID_{min}) + Index_{min}$$

At step B2, if the resource ID at the current index matches the targeted ID, then stop, the resource is found.

Otherwise, at step B3, adjust min-max for the next step.

At step B3(a), if ID>Current ID, then Index_min=Current Index and ID_min=Current ID.

At step B3(b), if ID<Current ID, then Index_max=Current Index and ID_max=Current ID.

At step B3(c), if Index_max<Index_min or ID_max<ID_min, then terminate, as the ID is not found.

At step B4, calculate the current index with adjusted min-max values.

$$\text{Index} = \frac{Index_{max} - Index_{min}}{ID_{max} - ID_{min}} * (ID - ID_{min}) + Index_{min}$$

At step B5, adjust the index knowing the deviation of the previous ID from the requested ID and continue from step B2.

$$\text{Index} = \frac{ID - Prev\ ID_{min}}{Prev\ ID - Prev\ ID_{min}} * (\text{Index} - Index_{min}) + Index_{min}$$

Various technical effects may be appreciated from the foregoing implementations. Employing any one or more of compression and encoding processes 110 reduces the size of any one or more of resource files 107. In turn, the size of application package 106 is reduced. This improves the speed with which application package 106 is downloaded from application provisioning service 123 to runtime platform 131. In addition to improving provisioning times, a reduced file size also saves bandwidth on the links or channels between application provisioning service 123 and runtime platform 131. Such technical effects are applicable to any provisioning scenario, but are especially beneficial in the context of mobile provisioning scenarios where bandwidth is at a premium.

Referring back to FIG. 1, build platform 101 is representative of any physical or virtual computing system, device, or collection thereof capable of hosting build environment 102 and implementing one or more compression and encoding processes, including similarity compression process 111, map-less encoding process 113, and bit-level compression process 115. Examples of build platform 101 include, but are not limited to server computers, web servers, application servers, rack servers, blade servers, virtual machine servers, or tower servers, as well as any other type of computing system, of which computing system 1001 illustrated in FIG. 10 is representative.

Service platform 121 is representative of any physical or virtual computing system, device, or collection thereof capable of hosting application provisioning service 123. Examples of service platform 121 include, but are not limited to server computers, web servers, application servers, rack servers, blade servers, virtual machine servers, or tower servers, as well as any other type of computing system, of which computing system 1001 illustrated in FIG. 10 is representative.

Runtime platform 131 is representative of any physical or virtual computing system, device, or collection thereof capable of executing local application 135 in the context of runtime environment 133. Examples of runtime platform 131 include, but are not limited to, smart phones, laptop computers, tablet computers, desktop computers, hybrid computers, gaming machines, smart televisions, virtual machines, and wearable devices, as well as any variation or combination thereof, of which computing system 1001 illustrated in FIG. 10 is representative.

Application 105 is representative of the build stage of any software application, module, component, or collection thereof. Application package 106 is representative of the provisioning stage of any application, module, component, or collection thereof. Local application 135 is representative of the runtime stage of any application, module, component, or collection thereof. Examples of local application 135 include, but are not limited to, email applications, cloud storage applications, productivity applications, calendar applications, real-time communication applications, blogging and micro-blogging applications, social networking applications, e-commerce applications, and gaming applications, as well as any other type of application.

Local application 135 may a locally installed and executed application, a streamed application, a mobile application, or any combination or variation thereof. In some implementations, local application 135 may be a browser-based application that executes in the context of a browser application. Local application 135 may be implemented as a stand-alone application or may be distributed across multiple applications.

Local application 135 may be one of a suite of applications in some implementations. In such scenarios, resource files 107 may be shared entirely or in part between the individual ones of the suite of application. Code 109 may also be shared in its entirety or in part.

FIG. 10 illustrates computing system 1001 that is representative of any system or collection of systems in which the various operational architectures, scenarios, and processes disclosed herein may be implemented. Examples of computing system 1001 include, but are not limited to, smart phones, laptop computers, tablet computers, desktop computers, hybrid computers, gaming machines, virtual machines, smart televisions, smart watches and other wearable devices, as well as any variation or combination thereof. Other examples include server computers, rack servers, web servers, cloud computing platforms, and data center equipment, as well as any other type of physical or virtual server machine, and any variation or combination thereof.

Computing system 1001 may be implemented as a single apparatus, system, or device or may be implemented in a distributed manner as multiple apparatuses, systems, or devices. Computing system 1001 includes, but is not limited to, processing system 1002, storage system 1003, software 1005, communication interface system 1007, and user interface system 1009. Processing system 1002 is operatively coupled with storage system 1003, communication interface system 1007, and user interface system 1009.

Processing system 1002 loads and executes software 1005 from storage system 1003. Software 1005 includes compression and encoding processes 1006, which are representative of the compression and encoding processes discussed with respect to the preceding FIGS. 1-8, including compression and encoding processes 110, similarity compression process 300, map-less encoding process 500, and bit-level compression process 700, as well as the aspects embodied in operational scenarios 400, 600, and 800.

Software 1005 may optionally include decompression and decoding processes 1008 capable of decompression and/or decoding resource strings when computing system 1001 is representative of a runtime platform. Software may also include a process or processes for implementing an enhanced naming convention as discussed herein with respect to FIG. 9.

When executed by processing system 1002 to enhance compression and encoding capabilities, software 1005 directs processing system 1002 to operate as described herein for at least the various processes, operational scenarios, and sequences discussed in the foregoing implementations. Computing system 1001 may optionally include additional devices, features, or functionality not discussed for purposes of brevity.

Referring still to FIG. 10, processing system 1002 may comprise a micro-processor and other circuitry that retrieves and executes software 1005 from storage system 1003. Processing system 1002 may be implemented within a single processing device, but may also be distributed across multiple processing devices or sub-systems that cooperate in executing program instructions. Examples of processing system 1002 include general purpose central processing units, application specific processors, and logic devices, as well as any other type of processing device, combinations, or variations thereof.

Storage system 1003 may comprise any computer readable storage media readable by processing system 1002 and capable of storing software 1005. Storage system 1003 may include volatile and nonvolatile, removable and non-removable media implemented in any method or technology for storage of information, such as computer readable instructions, data structures, program modules, or other data. Examples of storage media include random access memory, read only memory, magnetic disks, optical disks, flash memory, virtual memory and non-virtual memory, magnetic cassettes, magnetic tape, magnetic disk storage or other magnetic storage devices, or any other suitable storage media. In no case is the computer readable storage media a propagated signal.

In addition to computer readable storage media, in some implementations storage system 1003 may also include computer readable communication media over which at least some of software 1005 may be communicated internally or externally. Storage system 1003 may be implemented as a single storage device, but may also be implemented across multiple storage devices or sub-systems co-located or distributed relative to each other. Storage system 1003 may comprise additional elements, such as a controller, capable of communicating with processing system 1002 or possibly other systems.

Software 1005 may be implemented in program instructions and among other functions may, when executed by processing system 1002, direct processing system 1002 to operate as described with respect to the various operational scenarios, sequences, and processes illustrated herein. For example, software 1005 may include program instructions for implementing enhanced resource string compression and encoding, as well as an enhanced naming convention for resource strings.

In particular, the program instructions may include various components or modules that cooperate or otherwise interact to carry out the various processes and operational scenarios described herein. The various components or modules may be embodied in compiled or interpreted instructions, or in some other variation or combination of instructions. The various components or modules may be executed in a synchronous or asynchronous manner, serially or in parallel, in a single threaded environment or multi-threaded, or in accordance with any other suitable execution paradigm, variation, or combination thereof. Software 1005 may include additional processes, programs, or components, such as operating system software or other application software, in addition to or that include compression and encoding processes 1006. Software 1005 may also comprise firmware or some other form of machine-readable processing instructions executable by processing system 1002.

In general, software 1005 may, when loaded into processing system 1002 and executed, transform a suitable apparatus, system, or device (of which computing system 1001 is representative) overall from a general-purpose computing system into a special-purpose computing system customized to facilitate enhanced resource string handling. Indeed, encoding software 1005 on storage system 1003 may transform the physical structure of storage system 1003. The specific transformation of the physical structure may depend on various factors in different implementations of this description. Examples of such factors may include, but are not limited to, the technology used to implement the storage media of storage system 1003 and whether the computer-storage media are characterized as primary or secondary storage, as well as other factors.

For example, if the computer readable storage media are implemented as semiconductor-based memory, software 1005 may transform the physical state of the semiconductor memory when the program instructions are encoded therein, such as by transforming the state of transistors, capacitors, or other discrete circuit elements constituting the semiconductor memory. A similar transformation may occur with respect to magnetic or optical media. Other transformations of physical media are possible without departing from the scope of the present description, with the foregoing examples provided only to facilitate the present discussion.

Referring again to FIG. 2 as an example, through the operation of a computing system or systems of which computing system 1001 is representative, transformations may be performed with respect to the various scenarios described therein. As an example, resource string 205 compressed and encoded, thereby changing its state and the state of resource file 201.

Communication interface system 1007 may include communication connections and devices that allow for communication with other computing systems (not shown) over communication networks (not shown). Examples of connections and devices that together allow for inter-system communication may include network interface cards, antennas, power amplifiers, RF circuitry, transceivers, and other communication circuitry. The connections and devices may communicate over communication media to exchange communications with other computing systems or networks of systems, such as metal, glass, air, or any other suitable communication media. The aforementioned media, connections, and devices are well known and need not be discussed at length here.

User interface system 1009 is optional and may include a keyboard, a mouse, a voice input device, a touch input device for receiving a touch gesture from a user, a motion input device for detecting non-touch gestures and other motions by a user, and other comparable input devices and associated processing elements capable of receiving user input from a user. Output devices such as a display, speakers, haptic devices, and other types of output devices may also be included in user interface system 1009. In some cases, the input and output devices may be combined in a single device, such as a display capable of displaying images and receiving touch gestures. The aforementioned user input and output devices are well known in the art and need not be discussed at length here.

User interface system 1009 may also include associated user interface software executable by processing system 1002 in support of the various user input and output devices discussed above. Separately or in conjunction with each other and other hardware and software elements, the user interface software and user interface devices may support a graphical user interface, a natural user interface, or any other type of user interface.

Communication between computing system 1001 and other computing systems (not shown), may occur over a communication network or networks and in accordance with various communication protocols, combinations of protocols, or variations thereof. Examples include intranets, internets, the Internet, local area networks, wide area networks, wireless networks, wired networks, virtual networks, software defined networks, data center buses, computing backplanes, or any other type of network, combination of network, or variation thereof. The aforementioned communication networks and protocols are well known and need not be discussed at length here. However, some communication protocols that may be used include, but are not limited to, the Internet protocol (IP, IPv4, IPv6, etc.), the transfer control protocol (TCP), and the user datagram protocol (UDP), as well as any other suitable communication protocol, variation, or combination thereof.

In any of the aforementioned examples in which data, content, or any other type of information is exchanged, the exchange of information may occur in accordance with any of a variety of protocols, including FTP (file transfer protocol), HTTP (hypertext transfer protocol), REST (representational state transfer), WebSocket, DOM (Document Object Model), HTML (hypertext markup language), CSS (cascading style sheets), HTML5, XML (extensible markup language), JavaScript, JSON (JavaScript Object Notation), and AJAX (Asynchronous JavaScript and XML), as well as any other suitable protocol, variation, or combination thereof.

Certain inventive aspects may be appreciated from the foregoing disclosure, of which the following are various examples.

Example 1

A method to facilitate enhanced resource file compression comprising: ordering a set of resource strings in a resource file to produce an ordered set of resource strings in the resource file; and reducing a size of the resource file by, for any of the ordered set of resource strings that qualify for similarity compression, at least: identifying a similarity value representative of an extent to which an initial portion of a resource string is similar to a next resource string in the ordered set of resource strings; and replacing the initial portion of the resource string in the resource file with the similarity value while retaining in the file a remaining portion of the resource string that was not replaced by the similarity value.

Example 2

The method of Example 1 wherein ordering the set of resource strings in the resource file comprises alphabetizing the set of resource strings and wherein the method further comprises determining whether or not any given resource string of the ordered set of resource strings qualifies for the similarity compression based at least in part on whether or not the given resource string is followed by any other resource string in the ordered set of resource strings.

Example 3

The method of Examples 1-2 wherein each of the ordered set of resource strings comprises a set of characters and wherein the method further comprises further reducing the size of the resource file by, for any of the ordered set of resource strings that qualify for map-less encoding, at least: identifying a double-byte Unicode representation of each character in the set of characters in the resource string, wherein the double-byte Unicode representation comprises a lower byte and an upper byte; identifying at least one character in the set of characters for which the upper byte of the one character comprises a non-zero value, wherein the non-zero value indicates an occurrence of non-Latin characters; setting a value of an encoding byte to the non-zero value and retaining the encoding byte in the resource file to reflect the occurrence of the non-Latin characters; discarding the upper byte from the resource file for each of the set of characters; and retaining the lower byte in the resource file for each of the set of characters.

Example 4

The method of Examples 1-3 further comprising determining whether or not any of the ordered set of resource strings qualifies for the map-less encoding based at least in part on whether or not the set of characters for any given resource string of the ordered set of resource strings includes characters from more than two character ranges corresponding to more than two different languages.

Example 5

The method of Examples 1-4 further comprising, when a value of the lower byte of any of the non-Latin characters falls within a lower half of a range of possible values for the lower byte, shifting a value of the lower byte of any Latin characters into an upper half of the range of possible values for the lower byte.

Example 6

The method of Examples 1-5 further comprising shifting the encoding byte to reflect the shifting of the value of the lower byte of the Latin characters into the upper half of the range of the possible values for the lower byte.

Example 7

The method of Examples 1-6 wherein the lower byte retained in the resource file for each of the set of characters comprises an initial quantity of bits and wherein the method further comprises further reducing the size of the resource file by, for any of the ordered set of resource strings that qualify for bit-level compression, at least: defining a dictionary specific to the resource string to include one or more characters of the set of characters in the resource string; and for each of the set of characters in the resource string, encoding the character in the resource file in a subsequent quantity of bits that is less than the initial quantity of bits and that represents a position of the character in either the dictionary or in a range of characters not included in the dictionary.

Example 8

The method of Examples 1-7 wherein the lower byte comprises eight bits initially and five bits subsequent to the encoding.

Example 9

The method of Examples 1-8 further comprising determining whether or not any of the ordered set of resource strings qualify for bit-level compression based at least in part on a length of a given string of the ordered set of resource strings.

Example 10

The method of Examples 1-9 wherein the resource file comprises a one of a plurality of files associated with a productivity application and wherein the ordered set of resource strings describe features in the productivity application.

Example 11

The method of Examples 1-10 wherein the method further comprises further reducing the size of the resource file by, for any of the ordered set of resource strings that qualify for bit-level compression, at least: identifying a double-byte Unicode representation of each character in the set of characters in the resource string, wherein the double-byte Unicode representation comprises a lower byte and an upper byte, wherein the lower byte comprises an initial quantity of bits; defining a dictionary specific to the resource string to include one or more characters of the set of characters in the resource string; and for each of the set of characters in the resource string, encoding the character in the resource file in a subsequent quantity of bits that is less than the initial quantity of bits and that represents a position of the character in either the dictionary or in a range of characters not included in the dictionary.

Example 12

The method of Examples 1-11 wherein the resource file comprises the ordered set of resource strings and a resource name corresponding to each of the ordered set of resource strings.

Example 13

The method of Examples 1-12 wherein the method further comprises, for each of the ordered set of resources strings, hashing the resource name generate a hash value and replacing the resource name with a resource identifier that comprises the hash value.

Example 14

A method to facilitate enhanced resource file compression comprising: compressing at least a resource string of a plurality of resource strings in a resource file based at least in part on a similarity of the resource string to at least one other of the plurality of resource strings in the resource file; further compressing the resource string by encoding a double byte representation of each character in the resource string in a single byte representation of the character; and further compressing the resource string by compressing the single byte representation of the character from eight bits to five bits.

Example 15

An apparatus comprising: one or more computer readable storage media; and program instructions stored on the one or more computer readable storage media for reducing a size of a resource file that, when executed by a processing system, direct the processing system to at least, for any of an ordered set of resource strings in the resource file that qualify for similarity compression: identify a similarity value representative of an extent to which an initial portion of a resource string is similar to a next resource string in the ordered set of resource strings; and replace the initial portion of the resource string in the resource file with the similarity value while retaining in the file a remaining portion of the resource string that was not replaced by the similarity value.

Example 16

The apparatus of Example 15 wherein each of the ordered set of resource strings comprises a set of characters and wherein the program instructions further direct the processing system to reduce the size of the resource file by, for any of the ordered set of resource strings that qualify for map-less encoding, at least: identify a double-byte Unicode representation of each character in the set of characters in the resource string, wherein the double-byte Unicode representation comprises a lower byte and an upper byte; identify at least one character in the set of characters for which the upper byte of the one character comprises a non-zero value, wherein the non-zero value indicates an occurrence of non-Latin characters; set a value of an encoding byte to the non-zero value and retaining the encoding byte in the resource file to reflect the occurrence of the non-Latin characters; discard the upper byte from the resource file for each of the set of characters; and retain the lower byte in the resource file for each of the set of characters.

Example 17

The apparatus of Examples 15-16 wherein the program instructions further direct the processing system to determine whether or not any of the ordered set of resource strings qualifies for the map-less encoding based at least in part on whether or not the set of characters for any given resource string of the ordered set of resource strings includes characters from more than two character ranges corresponding to more than two different languages.

Example 18

The apparatus of Examples 15-17 wherein the program instructions further direct the processing system to, when a value of the lower byte of any of the non-Latin characters falls within a lower half of a range of possible values for the lower byte, shift a value of the lower byte of any Latin characters into an upper half of the range of possible values for the lower byte.

Example 19

The apparatus of Examples 15-18 wherein the program instructions further direct the processing system to shift the encoding byte to reflect the shift of the value of the lower byte of the Latin characters into the upper half of the range of the possible values for the lower byte.

Example 20

The apparatus of Examples 15-19 further comprising the processing system configured to execute the program instructions; wherein the lower byte retained in the resource file for each of the set of characters comprises an initial quantity of bits; and wherein the program instructions further direct the processing system to further reduce the size of the resource file by, for any of the ordered set of resource strings that qualify for bit-level compression, at least: define a dictionary specific to the resource string to include one or more characters of the set of characters in the resource string; and for each of the set of characters in the resource string, encode the character in the resource file in a subsequent quantity of bits that is less than the initial quantity of bits and that represents a position of the character in either the dictionary or in a range of characters not included in the dictionary.

The functional block diagrams, operational scenarios and sequences, and flow diagrams provided in the Figures are representative of exemplary systems, environments, and methodologies for performing novel aspects of the disclosure. While, for purposes of simplicity of explanation, methods included herein may be in the form of a functional diagram, operational scenario or sequence, or flow diagram, and may be described as a series of acts, it is to be understood and appreciated that the methods are not limited by the order of acts, as some acts may, in accordance therewith, occur in a different order and/or concurrently with other acts from that shown and described herein. For example, those skilled in the art will understand and appreciate that a method could alternatively be represented as a series of interrelated states or events, such as in a state diagram. Moreover, not all acts illustrated in a methodology may be required for a novel implementation.

The descriptions and figures included herein depict specific implementations to teach those skilled in the art how to make and use the best option. For the purpose of teaching inventive principles, some conventional aspects have been simplified or omitted. Those skilled in the art will appreciate variations from these implementations that fall within the scope of the invention. Those skilled in the art will also appreciate that the features described above can be combined in various ways to form multiple implementations. As a result, the invention is not limited to the specific implementations described above, but only by the claims and their equivalents.

The invention claimed is:

1. A method to facilitate enhanced resource file naming and compression comprising:
    ordering a set of resource strings in a resource file to produce an ordered set of resource strings in the resource file, wherein the resource file comprises the ordered set of resource strings and a resource name corresponding to each of the ordered set of resource strings;
    for each of the ordered set of resources strings, hashing the resource name to generate a hash value; and
    reducing a size of the resource file by replacing the resource name with a resource identifier that comprises the hash value;
    after reducing the size of the resource file, uploading the resource file to a download platform to be downloaded to and installed on local devices.

2. The method of claim 1 further comprising reducing a size of the resource file by, for any of the ordered set of resource strings that qualify for similarity compression, at least:
    identifying a similarity value representative of an extent to which an initial portion of a resource string is similar to a next resource string in the ordered set of resource strings; and
    replacing the initial portion of the resource string in the resource file with the similarity value while retaining in the resource file a remaining portion of the resource string that was not replaced by the similarity value.

3. The method of claim 2 wherein each of the ordered set of resource strings comprises a set of characters and wherein the method further comprises further reducing the size of the resource file by, for any of the ordered set of resource strings that qualify for map-less encoding, at least:
    identifying a double-byte Unicode representation of each character in the set of characters in the resource string, wherein the double-byte Unicode representation comprises a lower byte and an upper byte;
    identifying at least one character in the set of characters for which the upper byte of the one character comprises a non-zero value, wherein the non-zero value indicates an occurrence of non-Latin characters;
    setting a value of an encoding byte to the non-zero value and retaining the encoding byte in the resource file to reflect the occurrence of the non-Latin characters;
    discarding the upper byte from the resource file for each of the set of characters; and
    retaining the lower byte in the resource file for each of the set of characters.

4. The method of claim 3 further comprising determining whether or not any of the ordered set of resource strings qualifies for the map-less encoding based at least in part on whether or not the set of characters for any given resource string of the ordered set of resource strings includes characters from more than two character ranges corresponding to more than two different languages.

5. The method of claim 4 further comprising, when a value of the lower byte of any of the non-Latin characters falls within a lower half of a range of possible values for the lower byte, shifting a value of the lower byte of any Latin characters into an upper half of the range of possible values for the lower byte.

6. The method of claim 5 further comprising shifting the encoding byte to reflect the shifting of the value of the lower byte of the Latin characters into the upper half of the range of the possible values for the lower byte.

7. The method of claim 3 wherein the lower byte retained in the resource file for each of the set of characters comprises an initial quantity of bits and wherein the method further comprises further reducing the size of the resource file by, for any of the ordered set of resource strings that qualify for bit-level compression, at least:
    defining a dictionary specific to the resource string to include one or more characters of the set of characters in the resource string; and
    for each of the set of characters in the resource string, encoding the character in the resource file in a subsequent quantity of bits that is less than the initial quantity of bits and that represents a position of the character in either the dictionary or in a range of characters not included in the dictionary.

8. The method of claim 7 wherein the lower byte comprises eight bits initially and five bits subsequent to the encoding.

9. The method of claim 7 further comprising determining whether or not any of the ordered set of resource strings qualify for bit-level compression based at least in part on a length of a given string of the ordered set of resource strings.

10. The method of claim 1 wherein the resource file comprises a one of a plurality of files associated with a productivity application and wherein the ordered set of resource strings describe features in the productivity application.

11. The method of claim 1 wherein ordering the set of resource strings in the resource file comprises alphabetizing the set of resource strings.

12. An apparatus comprising:
    one or more non-transitory computer readable storage media; and
    program instructions stored on the one or more non-transitory computer readable storage media for facilitating enhanced resource file operations that, when executed by a processing system, direct the processing system to at least:
        when a resource string is invoked in a program using a hash value associated with the resource string, identify a location in a resource file from where to retrieve the resource string based on a relationship between the hash value, a total number of possible hash values, and a total number of resource strings in the resource file; and
        return the resource string to the program.

13. The apparatus of claim 12 wherein the program instructions further direct the processing system to, when the resource string has been compressed using similarity compression, decompress the resource string with respect to the similarity compression prior to returning the resource string to the program.

14. The apparatus of claim 13 wherein the program instructions further direct the processing system to, when the resource string has been encoded using map-less encoding, decode the resource string with respect to the map-less encoding prior to returning the resource string to the program.

15. The apparatus of claim 14 wherein the program instructions further direct the processing system to, when the resource string has been compressed using bit-level compression, decompress the resource string with respect to the bit-level compression prior to returning the resource string to the program.

16. The apparatus of claim 12 wherein the program instructions further direct the processing system to, when the resource string has been encoded using map-less encoding, decode the resource string with respect to the map-less encoding prior to returning the resource string to the program.

17. The apparatus of claim 16 wherein the program instructions further direct the processing system to, when the resource string has been compressed using bit-level compression, decompress the resource string with respect to the bit-level compression prior to returning the resource string to the program.

18. The apparatus of claim 12 further comprising the processing system operatively coupled to the non-transitory computer readable storage media and configured to read and execute the program instructions.

19. A system to facilitate enhanced resource file compression comprising:
- a non-transitory storage system having software stored thereon:
- a processing system operatively coupled to the non-transitory storage system that reads and executes the software; and
- program instructions stored on the non-transitory storage system that, when read and executed by the processing system, directs the processing system to at least:
  - decompress at least a resource string of a plurality of resource strings in a resource file based at least in part on a similarity of the resource string to at least one other of the plurality of resource strings in the resource file;
  - further decompress the resource string by decoding a single byte representation of each character in the resource string into a double byte representation of the character; and
  - further decompress the resource string by decompressing the single byte representation of the character from five bits to eight bits.

20. The system of claim 19 wherein the program instructions further direct the processing system to:
- when the resource string is invoked in a program using a hash value associated with the resource string, identify a location in the resource file from where to retrieve the resource string based on a relationship between the hash value, a total number of possible hash values, and a total number of resource strings in the resource file; and return the resource string to the program.

* * * * *